Nov. 25, 1958 A. P. KRUPER 2,862,109

PHOTOTRANSISTOR LIGHT DETECTOR

Filed Aug. 11, 1954

WITNESSES

Edwin E. Bassler

John B. Davidson

INVENTOR

Andrew P. Kruper,

BY

Paul E. Friedemann

ATTORNEY

United States Patent Office 2,862,109
Patented Nov. 25, 1958

2,862,109

PHOTOTRANSISTOR LIGHT DETECTOR

Andrew P. Kruper, Penn Township, Allegheny County, Pa., assignor to Westinghouse Electric Corporation, East Pittsburgh, Pa., a corporation of Pennsylvania Application August 11, 1954, Serial No. 449,225
6 Claims. (Cl. 250—211)

My invention relates to light detecting devices and more particularly to light detecting devices utilizing a transistor as the light sensitive element.

In semiconductor bodies generally, it has been found that minority carriers (either electrons or holes, depending on the type of semiconductor involved) are liberated by the action of light waves impinging thereon. The motion of the liberated carriers is random, and the carriers tend to entirely recombine unless a p–n junction is present within the semiconductor. In the latter case, the minority carriers at or near the junction diffuse towards the junction and provide a small "photoelectric" current. Movement of the carriers (or charges) is principally by diffusion, since the electric field in the semiconductor is negligibly small except at the junction itself. In a p–n–p or n–p–n junction transistor, the minority carriers diffuse toward the base region and become trapped between the two barriers. The space charge resulting therefrom lowers the potential barrier at the junction and allows majority carriers to flow across in greater numbers. The photoelectric current produced by the minority carriers serves merely as a controlling mechanism for a larger current flow.

It has been previously suggested that n-p-n junction transistors and p-n junction diodes be utilized as photocells to detect the absence or presence of light, and that the electric current controlled by the semi-conductor devices be amplified to further control mechanical devices such as relays. Reference is made to the following articles for a discussion of such devices and for an amplification of the semi-conductor photoelectric effect briefly described above:

"Properties of Germanium Phototransistors," by John N. Shive, Journal of the Optical Society of America, volume 43, No. 4, pages 239–244;

"Transistors and Their Circuits in the 4A Toll Crossbar Switching System" by P. Mallery, AIEE Transactions, Part 1, Communications and Electronics No. 8, September 1953, pages 388 to 392.

If the output signal from a semiconductor light detector is to be amplified to a strength sufficient to actuate a relay or similar device, it is much easier to amplify the output signal if it should be in the form of an alternating current rather than a direct current. In both articles referenced above, it is suggested that the light impinging on the semiconductor body be modulated for this purpose. Of necessity, this involves an arrangement such as a motor-driven, perforated rotating disc (or chopper wheel) interposed between the light source and the semiconductor. Such a device is clumsy, relatively expensive, and quite bulky, and is particularly objectionable in such applications as the crossbar switching system suggested by Mallery. On the other hand, where modulated light is not utilized to generate an alternating current, the dark current (or current which flows when no light impinges on the phototransistor) becomes quite important, inasmuch as it can adversely affect the operation of the controlled system. Since the dark current is directly related to the operating temperature of the transistor, it may be necessary to provide a temperature controlled enclosure for the transistor in order to eliminate the adverse effects of dark current.

Accordingly, it is an object of my invention to produce a light detector having an alternating voltage output signal.

Another object is to provide a light detector with an alternating voltage output signal wherein only static components are utilized.

Still another object is to provide a light detector having an alternating voltage output signal, the amplitude of which is substantially constant over a wide range of light intensity.

A still further object is to provide a light detector utilizing a semiconductor-type photocell, including compensation for variations in photocell characteristics with variations in operating temperatures.

Other objects and features of my invention will be more readily understood from a consideration of the detailed discussion which follows when taken in conjunction with the accompanying drawings, wherein.

My invention makes use of the effective shift in bias on a light-sensitive transistor brought about by impingement of light rays thereon to gate an alternating voltage signal coupled between the base and control electrodes thereof. The light rays cause a shift in the operating point of the collector-base current characteristic such that if the transistor is electrically biased to cut-off with no light directed thereon, the alternating current signal will appear in the output circuit when light rays are concentrated on the transistor. Likewise, if the electrical bias is adjusted to a value that will permit the alternating voltage signal to appear in the output circuit with no light on the transistor, light impingement will drive the transistor to collector current saturation so that the signal will no longer appear in the output circuit.

A feature of the invention is that it can readily be compensated for variations in photocell characteristics caused by temperature variations merely by inserting a temperature sensitive resistance means in the bias source such that the bias is increased with increase in operating temperature. In this manner the dark current of the transistor will remain substantially constant, the tendency of the dark current to increase being opposed by the increased bias imposed on the transistor.

Figure 1:
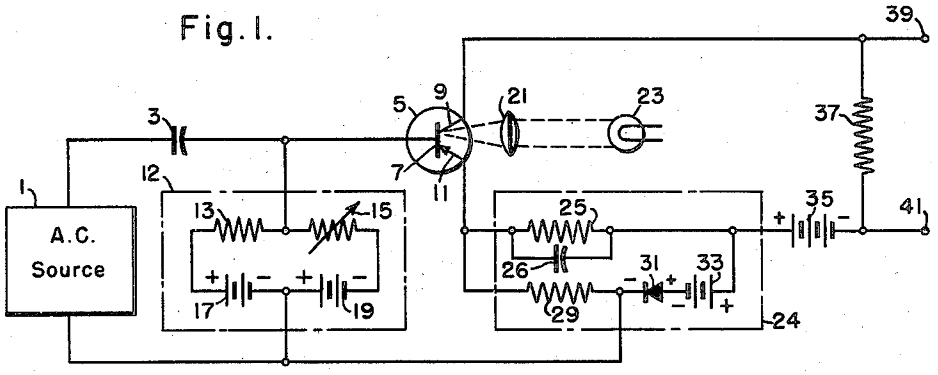
Figure 1 is a schematic diagram of a preferred embodiment of my invention.

Referring now to Fig. 1, there is shown a phototransistor 5, which is illustrated as being of the p-n-p type junction transistor, although an n-p-n transistor may be used therefor with equal facility. The transistor is preferably encased in clear plastic or other similar enclosure which will pass light of virtually all wave lengths. This type of transistor is particularly sensitive to light radiation having wavelengths of 600 to 1800 millimicrons and it is important that the encasement pass light in this band.

Bias for the phototransistor is provided by temperature compensated, variable bias network 12 serially connected with a delayed action inverse feedback network 24 between base electrode 7 and emitter electrode 11 of the transistor 5. The variable bias source includes serially connected, temperature-compensated resistor 13 and D. C. source 17 in parallel with serially connected variable resistor 15 and D. C. source 19. Resistor 13 should have a negative temperature coefficient so that the resistance thereof decreases with increase in ambient temperature. Resistor 15 is preferably non-temperature-sensitive and may be of any such type well known to the art. Sources 17 and 19 may be ordinary batteries. The juncture of resistors 13 and 15 is connected directly to base electrode 7 of transistor 5. The negative terminal of battery 17 and the positive terminal of battery 19 are connected together and to a terminal of inverse feedback network 24 in a manner that will be described below.

Inverse feedback device 24 provides an increasingly positive bias on base electrode 7 relative to emitter electrode 11 after the emitter-to-collector current of the transistor reaches a given value in order to prevent light rays impinging on the transistor from driving the collector current thereof to saturation. As shown, this network includes a resistor 25 serially connected with emitter-to-collector potential source 35 and output impedance 37, all of which are serially connected between emitter and collector in the order named. In parallel with the resistor 25 are resistor 29, half-wave rectifier 31, potential source 33, all of which are serially connected between emitter 11 and the positive terminal of potential source 35 in the order named. Condenser 26 is also in parallel with resistor 25 in order to bypass the A. C. component of collector current and make network 24 responsive only to the D. C. collector current. Half-wave rectifier 31, which may be a selenium or germanium semiconductor-type rectifier well known to the art, is poled so as to oppose current flow from emitter 11 to potential source 33. The polarity of potential source 33 is such that the negative terminal thereof is connected to half-wave rectifier 31 and the positive terminal thereof is connected to the positive terminal of potential source 35. Direct current potential sources 33 and 35 may be batteries or other direct current sources known to the art.

The juncture of resistor 29 and half-wave rectifier 31 is connected to the juncture of D. C. sources 17 and 19. The output voltage of D. C. source 33 should be slightly less than the voltage across resistor 25 that will be produced by the maximum desired emitter current. As soon as the current through resistor 25 is such as to exceed the voltage of D. C. source 33, current will flow through resistor 29 so as to produce an inverse bias signal that will limit further increase of emitter current from transistor 5.

An alternating current source 1, which may be an ordinary audio frequency generator, is coupled across the terminals of bias network 12 by means of coupling capacitor 3. The output signal of this signal source thus is imposed between base 7 and emitter 11 of transistor 5 through inverse feedback network 24.

Figure 2:
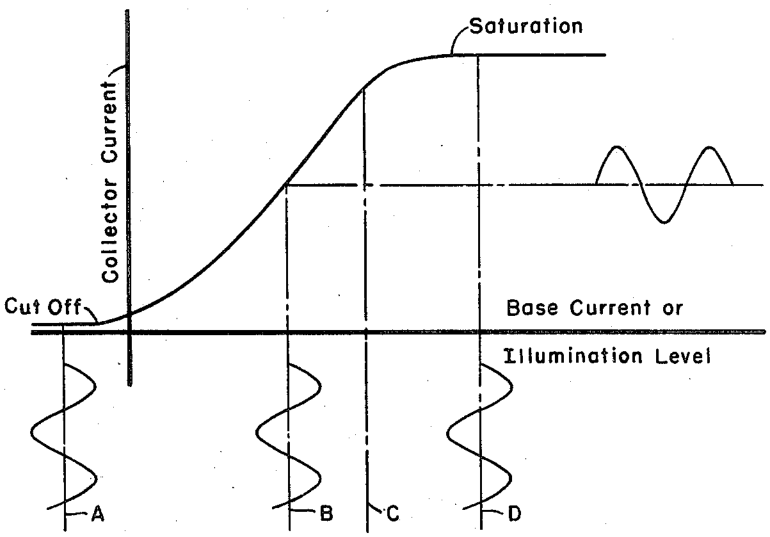
Fig. 2 is a graph of the collector current of a transistor suitable for use with my invention as a function of the illumination level thereof with a constant base current, which graph is useful in understanding the operation of my invention. This graph is also indicative of the variation of collector current as a function of base current with the illumination level held constant.

Radiation from light source 23, which may be an ordinary incandescent lamp, is concentrated on a junction of transistor 5 by means of lens 21. With no light directed on the transistor, the output bias voltage of source 12 is such as to adjust the base current of transistor 5 to a value that will limit the collector current at cutoff, as shown at illumination level A in Fig. 2. When light radiation impinges upon the transistor, the operating point is shifted to illumination level B on the characteristic curve of Fig. 2 and the alternating current output signal of Fig. 1 will appear across output impedance 37. If the light radiation should become so intense as to produce operation, at illumination level C, the voltage drop across resistor 25 will exceed the voltage of D. C. source 33 and the voltage drop across resistor 29 produced thereby will limit further increase in current from transistor 5. In this manner, operation of the light detector will become independent of light intensity inasmuch as the transistor device cannot be driven into the saturation region of its collector current vs. illumination characteristic. The output signal derived across resistor 37 may be amplified and used to actuate mechanical devices as taught by Mallery, supra.

Under certain conditions of operation, it may be desirable to have an output signal when there is no light impingement upon the transistor, and no output signal when light radiation is directed at the transistor. In this case, inverse feedback network 24 may be eliminated and the bias voltage output of network 12 be set so as to produce operation along the linear portion of the collector current vs. base current characteristic as indicated at illumination level B. When light radiation is directed upon the transistor, operation thereof will be shifted to the saturation region of the transistor as indicated at D, and no output signal will appear across the output terminals of the detector.

In accordance with the teachings of my invention, there has been provided a light detector having an alternating voltage output signal utilizing only static components wherein the output signal is substantially constant over a wide range of light intensity and wherein the operation is substantially independent of operating temperature over a considerable temperature range.

It will be understood that numerous modifications other than those hereinbefore suggested will occur to those skilled in the art without departing from my inventive concept.

I claim as my invention:

1. A light detecting device comprising: junction-type photosensitive transistor means having emitter, base, and collector electrodes, the collector current of said transistor means being adapted to increase with increase in light intensity at a p-n junction thereof; alternating voltage source means coupled between said base electrode and an adjoining electrode; bias voltage means connected between said emitter and said base including a delayed action inverse feedback means adapted to increase bias voltage with increase in emitter-to-collector current beyond a given value, and said bias voltage means being adapted to maintain the collector current at cutoff with no light radiation impinging on said transistor, said bias voltage means and said inverse feedback means being serially connected between said base and emitter electrodes; a light source, the radiation from which is adapted to impinge upon the juncture of two electrodes of said transistor; and a source of operating potential and an output impedance serially connected between said emitter and said collector.

2. A light detecting device comprising: junction-type photosensitive transistor means having emitter, base, and collector electrodes, the collector current of which transistor means increases with increase in light intensity at a p-n junction thereof; alternating voltage source means coupled between said base electrode and one of said other electrodes; bias voltage means connected between said emitter and said base including a delayed action inverse feedback means adapted to increase bias voltage with increase in emitter-to-collector current beyond a given value less than the saturation current of said transistor, and said bias voltage means being temperature compensated to maintain the dark current of the transistor constant and being adapted to maintain the collector current at cutoff with no light radiation impinging on said transistor, said bias voltage means and said inverse feedback means being serially connected between said base and emitter electrodes; and a source of operating potential and an output impedance serially connected between said emitter and said collector.

3. A light detecting device comprising: photosensitive junction transistor means having emitter, base, and collector electrodes, the collector current of which transistor means increases with increase in light intensity at a p-n junction thereof; an alternating voltage source coupled between said emitter and base electrodes; bias voltage means connected between said emitter and said base including a delayed action inverse feedback means adapted to increase bias voltage with increase in emitter-to-collector current beyond a given value, and temperature compensated bias voltage means adapted to maintain the collector current at cutoff with no light radiation impinging on said transistor, said bias voltage means and said inverse feedback means being serially connected between said base and emitter electrodes; said inverse feedback means comprising a first resistance means adapted to receive the emitter-to-collector current of said transistor means, a second resistance means adapted to receive the emitter-to-base current of said transistor means, and means adapted to send a current thorugh said second resistance means in opposition to said emitter-to-base current proportional to the extent to which the voltage drop across said first resistance means exceeds a given voltage, said temperature compensated bias source comprising a tapped direct voltage potential source, a variable substantially non-temperature-sensitive resistance element and a resistance element having a negative temperature coefficient serially connected across said potential source, said base and emitter electrodes being respectively connected to the juncture of said resistance elements and to the tap on said potential source; a light source, the radiation from which is adapted to impinge upon the juncture of two electrodes of said transistor; and a source of operating potential and an output impedance serially connected between said emitter and said collector such that an alternating voltage from said alternating voltage source is gated to said output impedance by light impingement upon said transistor at a junction thereof.

4. A light detector comprising: photosensitive junction transistor means including base, emitter, and collector electrodes, the collector current of which is variable in accordance with light impinging at and in the vicinity of the juncture of the electrodes thereof; alternating voltage signal means coupled between the base electrode and an electrode adjoining thereto; temperature compensated bias means adapted to bias said phototransistor at least to cutoff with no light impinging thereon, so that the alternating voltage output of said signal means will not appear in the collector circuit of said transistor, light impingement on said transistor overcoming said bias means so as to permit said alternating voltage signal to appear in the collector circuit of said transistor, and means coupled to said collector electrode adapted to receive an alternating output signal therefrom.

5. A light detector comprising: photosensitive junction transistor means including base, emitter, and collector electrodes, the collector current of which is variable in accordance with light impinging at and in the vicinity of the juncture of the electrodes thereof; alternating voltage signal means coupled between the base and emitter electrodes thereof; bias means adapted to bias said phototransistor in the vicinity of cutoff with no light impinging thereon, so that the alternating voltage output of said signal means will not appear in the collector circuit of said transistor, light impingement on said transistor overcoming said bias means so as to permit said alternating voltage signal to appear in the output circuit of said transistor, means coupled to said collector electrode adapted to receive an alternating output signal therefrom, and means coupled to said transistor adapted to limit the emitter current thereof to values less than the saturation current thereof.

6. A light detecting device comprising: photosensitive junction transistor means having emitter, base, and collector electrodes, the collector current of which transistor means increases with increase in light intensity at a p-n junction thereof; an alternating voltage source coupled between said emitter and base electrodes; bias voltage means connected between said emitter and said base adapted to set the bias thereon at a value such as to maintain said collector current substantially at cut-off with no light impinging on said transistor; a light source, the radiation from which is adapted to impinge upon the junction of two electrodes of said transistor with sufficiently intensity to drive said collector current toward saturation; and a source of operating potential and an output impedance serially connected between said emitter and said collector.

References Cited in the file of this patent

UNITED STATES PATENTS

| | | |
|---|---|---|
| 2,208,665 | Crabtree | July 23, 1940 |
| 2,369,030 | Edwards | Feb. 6, 1945 |
| 2,548,901 | Moe | Apr. 17, 1951 |
| 2,569,347 | Shockley | Sept. 25, 1951 |
| 2,570,978 | Pfann | Oct. 9, 1951 |
| 2,579,336 | Rack | Dec. 18, 1951 |
| 2,691,736 | Haynes | Oct. 12, 1954 |

OTHER REFERENCES

Reich: "Theory and Application of Electron Tubes," 1944, second ed., page 197, McGraw-Hill Book Co., Inc., N. Y.

Shea: "Principles of Transistor Circuits," 1953, pages 177–179, John Wiley and Sons, Inc., N. Y.